(12) United States Patent
Lee et al.

(10) Patent No.: US 10,859,237 B1
(45) Date of Patent: Dec. 8, 2020

(54) ASYMMETRIC DIFFUSION LENS FOR LED BACKLIGHT UNIT

(71) Applicant: HL OPTICS CO., LTD., Hwaseong-si (KR)

(72) Inventors: Kang Hyun Lee, Pyeongtaek-si (KR); Dong Sun Jeong, Daegu (KR)

(73) Assignee: HL OPTICS CO., LTD., Hwaseong-si (KR)

( * ) Notice: Subject to any disclaimer, the term of this patent is extended or adjusted under 35 U.S.C. 154(b) by 0 days.

(21) Appl. No.: 16/903,130

(22) Filed: Jun. 16, 2020

(30) Foreign Application Priority Data

Jun. 17, 2019 (KR) .................. 10-2019-0071235

(51) Int. Cl.
*F21V 5/04* (2006.01)
*F21V 3/04* (2018.01)
*F21Y 115/10* (2016.01)
*G02B 3/00* (2006.01)

(52) U.S. Cl.
CPC .............. *F21V 5/045* (2013.01); *F21V 3/049* (2013.01); *F21V 5/046* (2013.01); *F21V 5/048* (2013.01); *F21Y 2115/10* (2016.08); *G02B 2003/0093* (2013.01)

(58) Field of Classification Search
CPC .. F21V 5/046; F21V 5/048; G02B 2003/0093
See application file for complete search history.

(56) References Cited

U.S. PATENT DOCUMENTS

2013/0314927 A1* 11/2013 Chae ................. G02B 19/0014
362/329
2018/0172238 A1* 6/2018 Camras ................. F21S 41/25

FOREIGN PATENT DOCUMENTS

KR 10-2015-0024529 A 3/2015

* cited by examiner

*Primary Examiner* — Sean P Gramling
(74) *Attorney, Agent, or Firm* — Knobbe Martens Olson & Bear LLP

(57) ABSTRACT

The present disclosure relates to an asymmetric diffusion lens for a backlight unit, which includes a diffusion part of which an upper surface has an elliptical shape having a major axis and a minor axis, and a lower surface has a circular shape, a concave accommodation part provided at a center of the lower surface of the diffusion part to provide a space in which an LED package is accommodated, an incidence surface which is a boundary surface between the concave accommodation part and the diffusion part, and an exit surface as side surfaces and the upper surface of the diffusion part.

6 Claims, 6 Drawing Sheets

ASYMMETRIC DIFFUSION LENS FOR LED BACKLIGHT UNIT

CROSS-REFERENCE TO RELATED APPLICATION

This application claims priority to and the benefit of Korean Patent Application No. 10-2019-0071235, filed on Jun. 17, 2019, the disclosure of which is incorporated herein by reference in its entirety.

BACKGROUND

1. Field

The present disclosure relates to an asymmetric diffusion lens for a light emitting diode (LED) backlight unit, and more specifically, to an asymmetric diffusion lens for an LED backlight unit which may be miniaturized.

2. Discussion of Related Art

Recently, a method of increasing the output of an individual light emitting diode (LED) and reducing the number of LEDs per unit area has been proposed to improve the price competitiveness of a backlight unit (BLU) using LEDs.

Light emitted from the LEDs has a characteristic in which light dispersion is concentrated in a center portion in comparison with the surroundings. Accordingly, the light is not evenly distributed to the surroundings and a front surface portion of the LED is brighter and becomes darker further away from the front.

Researches on various types of diffusion lenses which effectively and uniformly diffuse the light generated from the LEDs proceed.

As an example of an asymmetric lens having asymmetric light distribution characteristic, there is a lens described in FIG. 15 of Application Patent No. 10-1861233 (a light emitting unit array and a light diffusing lens suitable for the same, registered on May 18, 2018).

The disclosure of this section is to provide background information relating to the invention. Applicant does not admit that any information contained in this section constitutes prior art.

SUMMARY

The present disclosure is directed to providing an asymmetric diffusion lens for a light emitting diode (LED) backlight unit which is easily designed and advantageous for miniaturization.

According to an aspect of the present disclosure, there is provided an asymmetric diffusion lens for a light emitting diode (LED) backlight unit that includes a diffusion part of which an upper surface has an elliptical shape having a major axis and a minor axis, and a lower surface has a circular shape, a concave accommodation part provided at a center of the lower surface of the diffusion part to provide a space in which an LED package is accommodated, an incidence surface which is a boundary surface between the concave accommodation part and the diffusion part, and an exit surface as side surfaces and the upper surface of the diffusion part.

In one embodiment of the present disclosure, when an inclination angle (referred to as an angle formed by a virtual vertical line in an upward direction from an edge of the lower surface of the diffusion part and a side surface) of the side surface extending to the major axis of the diffusion part is referred to as a first inclination angle, and an inclination angle of the side surface extending to the minor axis is referred to as a second inclination angle, an inclination angle at the other side surface may be inclined at an angle between the first inclination angle and the second inclination angle.

In one embodiment of the present disclosure, a ratio of the second inclination angle to the first inclination angle may be greater than 1.1 and smaller than 1.8.

In one embodiment of the present disclosure, the upper surface of the diffusion part may be concave so that a center thereof may be deepest.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

In order to sufficiently understand the configurations and effects of the present disclosure, exemplary embodiments of the present disclosure will be described with reference to the accompanying drawings. However, the present disclosure is not limited to the following embodiments, and may be implemented in various forms, and variously changed. However, descriptions of the embodiments are provided so that the present disclosure is completely disclosed, and the scope of the present disclosure is fully informed to those skilled in the art. In the accompanying drawings, elements are shown in exaggerated sizes in comparison with actual sizes for convenience of description, and a ratio of each element may be magnified or miniaturized.

Further, it should be understood that, although the terms "first," "second," and the like may be used herein to describe various elements, the elements should not be limited by the terms. The terms may be used only to distinguish one element from another. For example, 'a first element' could be referred to as 'a second element', and similarly, 'a second element' could be referred to as 'a first element' without departing from the scope of the present disclosure. Further, the singular form is intended to also include the plural form, unless the context clearly indicates otherwise. Terms used in the embodiments of the present disclosure may be understood as meanings generally known by those skilled in the art.

Meanwhile, symmetrically and uniformly diffusing the light emitted from the LEDs may be necessary but depending on arrangement of the LEDs, diffusing more light only in a specific direction may also be necessary.

For example, an LED arrangement interval of the backlight unit in a row-direction can be wider or narrower in comparison with the LED arrangement interval of the backlight unit in a column direction. In the foregoing example, when the output of the LED is increased and the number of installations is reduced, the LEDs are arranged at the asymmetric interval.

When the arrangement of the LEDs has a lateral interval more compact than a vertical interval, uniform distribution of the light as a whole can be obtained when the light is diffused more in a vertical direction and diffused less in a lateral direction.

In one implementation, a lens has an elongated optical pattern formed on a target surface in one axial direction perpendicular to a center axis, and accordingly, a shape of the lens itself has a shape the same as a shape of desired light distribution.

However, both a light input part and a light output part have asymmetric shapes, the forgoing structure is difficult to design, downsizing of the lens is difficult, and a unit price increases.

Hereinafter, an asymmetric diffusion lens for a light emitting diode (LED) backlight unit according to one embodiment of the present disclosure will be described with reference to the accompanying drawings.

Figure 1:
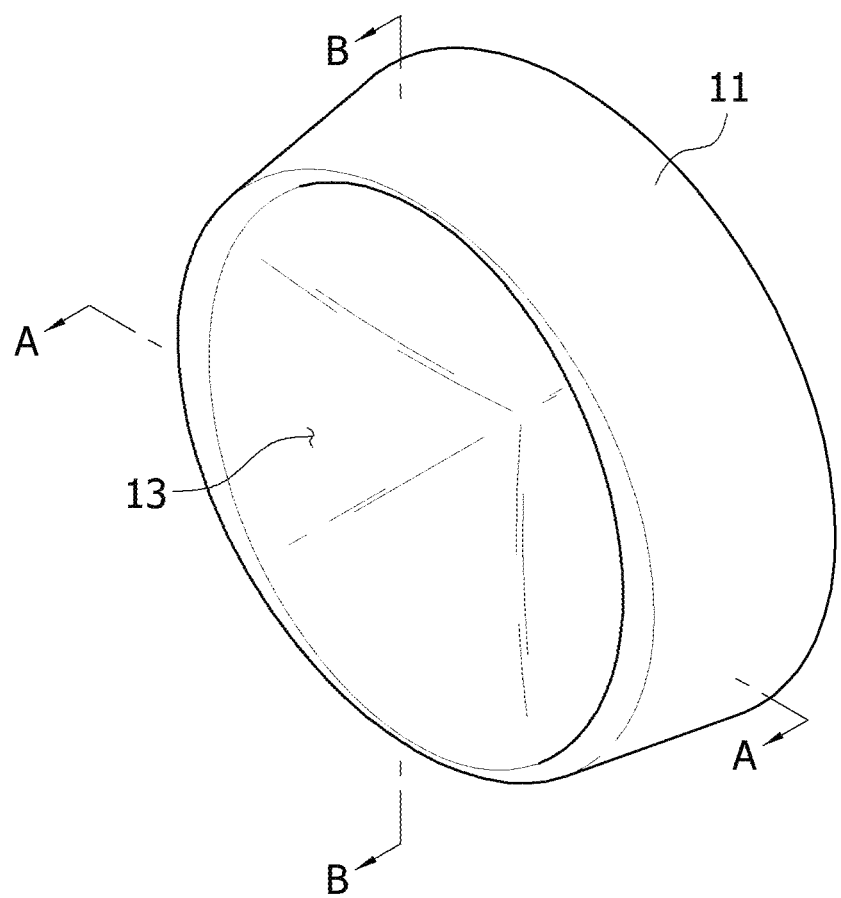
FIG. 1 is a configuration diagram of an asymmetric diffusion lens for a light emitting diode (LED) backlight unit according to an exemplary embodiment of the present disclosure.
Figure 2:
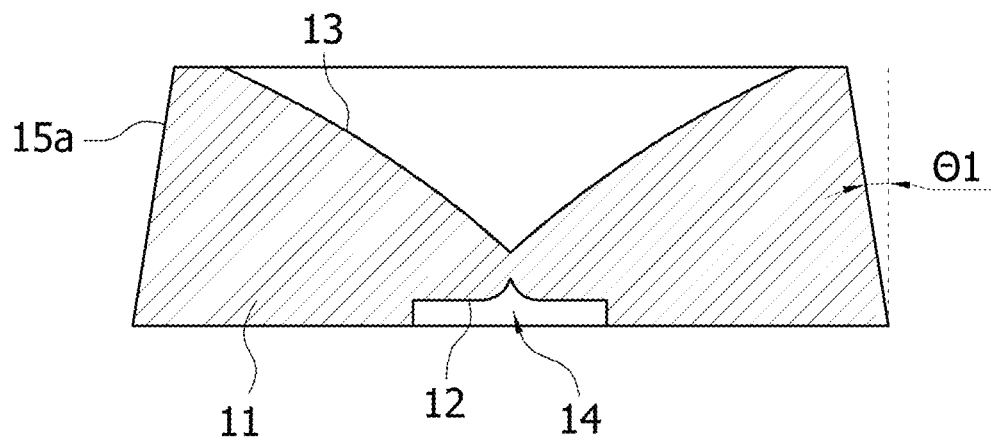
FIG. 2 is a cross-sectional view taken along line A-A in FIG. 1.
Figure 3:
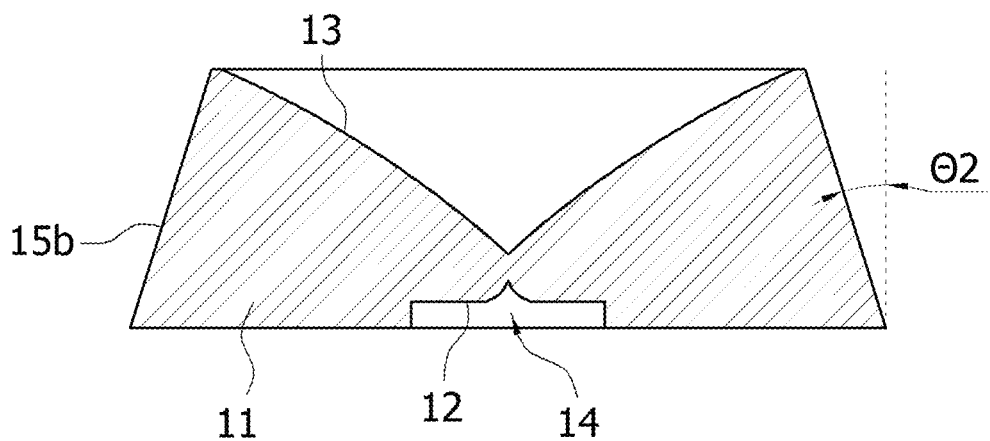
FIG. 3 is a cross-sectional view taken along line B-B in FIG. 1.
Figure 4:
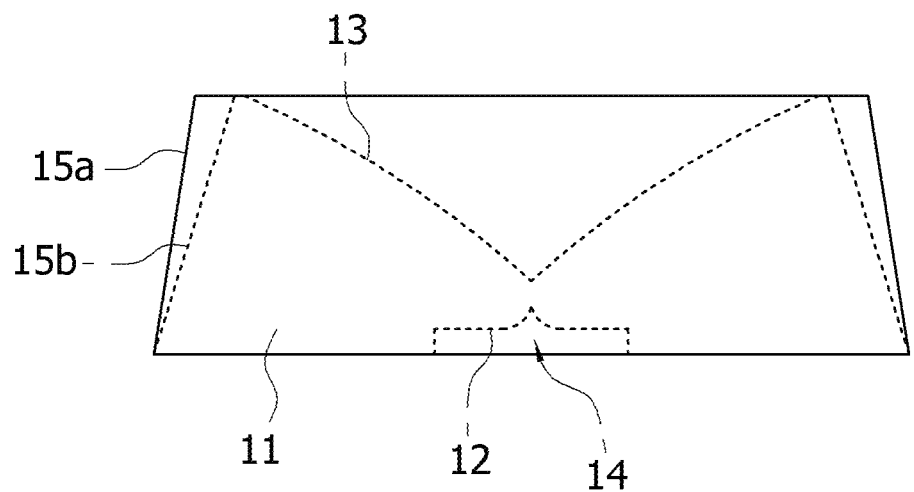
FIG. 4 is a cross-sectional view displaying FIGS. 2 and 3 in a superimposed manner.
Figure 5:
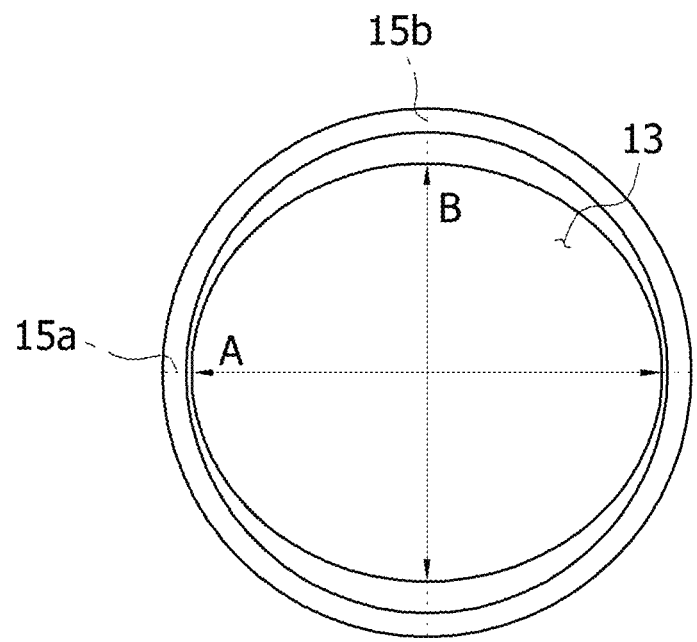
FIG. 5 is a plan view of the present disclosure.

FIG. 1 is a configuration diagram of an asymmetric diffusion lens for an LED backlight unit according to an exemplary embodiment of the present disclosure, FIG. 2 is a cross-sectional view taken along line A-A in FIG. 1, FIG. 3 is a cross-sectional view taken along line B-B in FIG. 1, FIG. 4 is a view illustrating a state in which cross-sectional outlines in FIGS. 2 and 3 are superimposed, and FIG. 5 is a plan view of the present disclosure.

Referring to FIGS. 1 to 5, an asymmetric diffusion lens 10 for an LED backlight unit according to the exemplary embodiment of the present disclosure includes a diffusion part 11 having a disk shape of which a height is smaller than a diameter, a concave accommodation part 14 provided at a center of a lower surface of the diffusion part 11 to provide a space in which an LED package (not shown) is accommodated, an incidence surface 12 which is a boundary surface between the concave accommodation part 14 and the diffusion part 11, and an exit surface 13 as side surfaces and an upper surface of the diffusion part 11, and the upper surface and the lower surface of the diffusion part 11 are respectively formed in an elliptical shape and a circular shape.

Configurations and actions of the above-described exemplary embodiment of the present disclosure will be described in more detail.

First, the diffusion part 11 is provided to substantially form an outer shape of the asymmetric diffusion lens 10 of the present disclosure, and diffuses light which is incident through the incidence surface 12 and emits the light through the exit surface 13 in an asymmetric light distribution using various materials and shapes.

Although the drawings illustrate that the exit surface 13 of the upper surface has a concave shape as an example of the diffusion part 11, a flat surface or convex surface may also be used as the exit surface 13.

However, in a feature of the present disclosure, as in the example of the drawing, it is preferable to use the diffusion part 11 having a concave shape in which the exit surface 13 of the upper surface is concave to provide light distribution in a shape similar to a rectangular shape other than a circular shape in a plan view.

This is because as light of the LED package incident through the incidence surface 12 is emitted through the exit surface 13 of the concave upper surface and is partially reflected, it is advantageous to be emitted through the exit surface 13 of the side surface.

As described above, in the diffusion part 11, since the upper surface has an elliptical shape, and the lower surface has a circular shape, the side surfaces which connect the elliptical upper surface and the circular lower surface have different lengths and inclination degrees according to positions.

A first inclination angle $\theta 1$ of a side surface 15a in FIG. 2 is smaller than a second inclination angle $\theta 2$ of a side surface 15b in FIG. 3, and the side surface 15a also has a smaller length than the side surface 15b.

In the above, the first inclination angle $\theta 1$ and the second inclination angle $\theta 2$ are angles respectively formed by the side surfaces 15a and 15b and a virtual vertical line from an end of the lower surface.

FIGS. 2 and 3 are cross-sectional views illustrating the positions of the second inclination angle $\theta 2$ which is the greatest angle and the first inclination angle $\theta 1$ which is the smallest angle to clearly illustrate a difference between the inclination angles, and the inclination angles of side surfaces at the other regions have inclination angles between the first inclination angle $\theta 1$ and the second inclination angle $\theta 2$.

FIG. 4 is a view illustrating that the cross-sectional views shown in FIGS. 2 and 3 are superimposed so that features of the present disclosure are shown, and the shape of the diffusion part 11 according to the present disclosure may be easily seen through the plan view in FIG. 5.

Referring to FIG. 5, FIG. 2 is a cross-sectional view of a major axis A of the elliptical upper surface of the diffusion part 11, FIG. 3 is a cross-sectional view of a minor axis B of the elliptical upper surface.

Diameters of other regions other than the major axis A and the minor axis B have lengths between those of the minor axis B and the major axis A, and the inclination angles of the side surfaces connected to the circular lower surface of the diffusion part 11 have inclination angles between the first inclination angle $\theta 1$ and the second inclination angle $\theta 2$.

Figure 6:
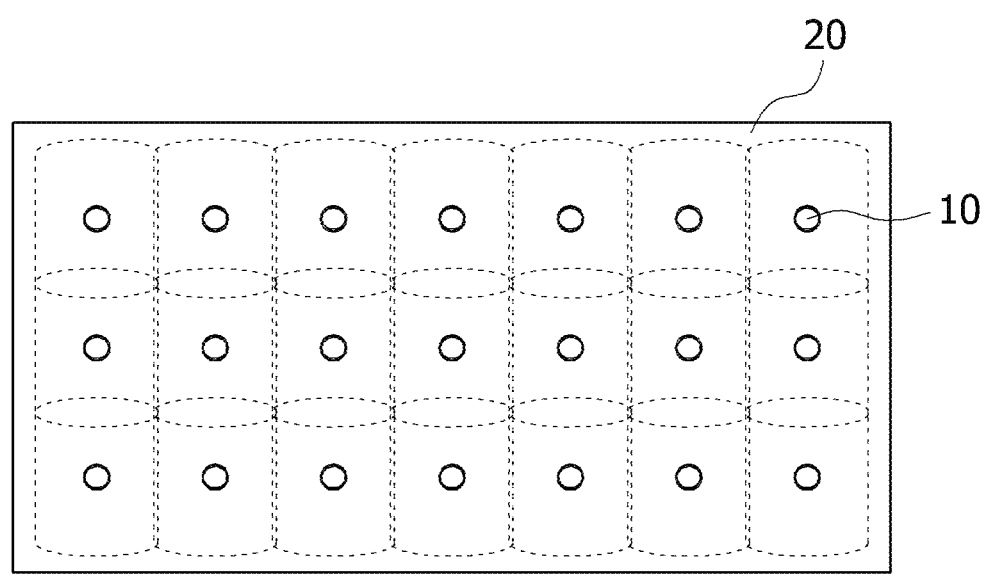
FIG. 6 is a photograph illustrating the light distribution characteristics of the present disclosure.

Thus, light emitted through the side surface of the diffusion part 11 due to a difference between the inclination angles of the side surfaces has different emission angles, and accordingly, as shown in FIG. 6, and each has a light distribution characteristic similar to a rectangular shape extending to one side.

Due to the above-described light distribution characteristic, the LED packages may be applied to a backlight unit 20 where the LED packages are disposed at various intervals to form an overall uniform light distribution pattern.

In the example of FIG. 6, a shape of the light distribution pattern may be changed according to a ratio of the major axis A and the minor axis B of the upper surface of the diffusion part 11 or a ratio of the first inclination angle $\theta 1$ and the second inclination angle $\theta 2$.

A ratio of the second inclination angle $\theta 2$ to the first inclination angle $\theta 1$ may be defined by Equation 1 below.

$$1.8 > \theta 2/\theta 1 > 1.1 \qquad \text{[Equation 1]}$$

In the above-described Equation 1, the ratio of the second inclination angle $\theta 2$ to the first inclination angle $\theta 1$ is not only for the shape of the light distribution pattern but also for preventing image quality degradation.

Figure 7:
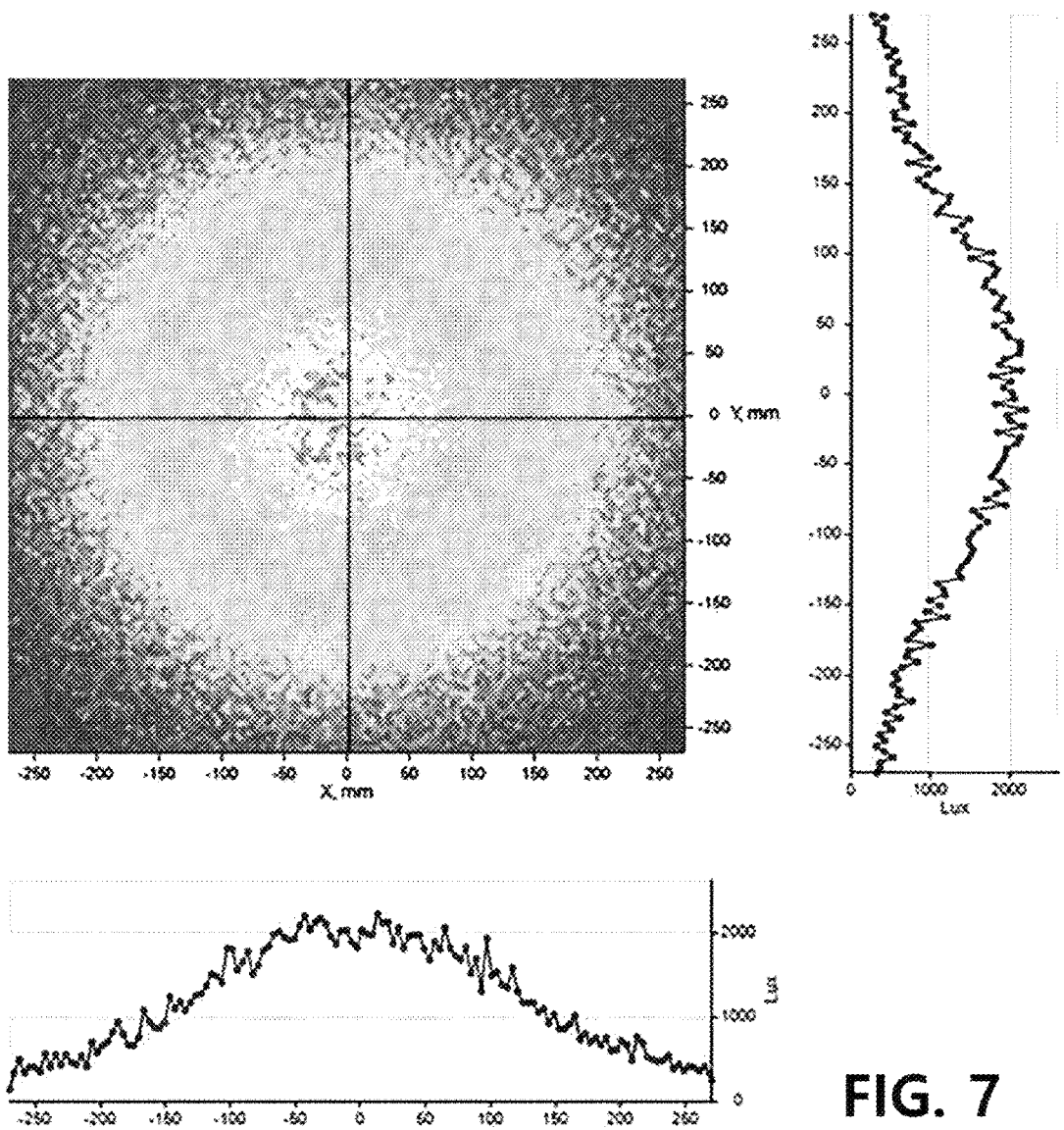
FIGS. 7 and 8 are photographs illustrating the light distribution characteristics according to a ratio of a second inclination angle to a first inclination angle.
Figure 8:
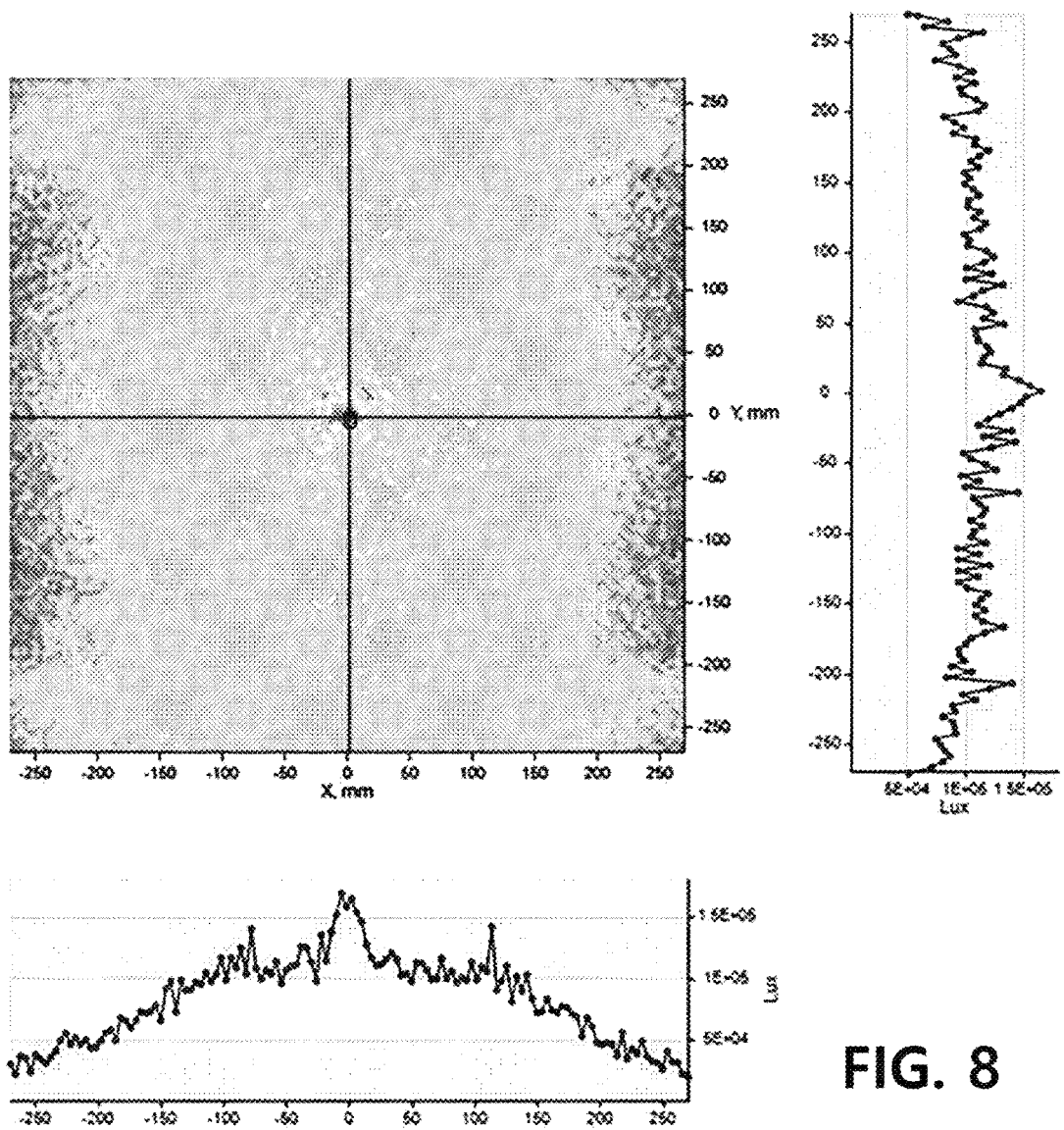

FIG. 7 is a photograph illustrating the light distribution pattern in the case in which the ratio of the second inclination angle θ2 to the first inclination angle θ1 is 1.1, and FIG. 8 is a photograph illustrating the light distribution pattern in the case in which the ratio of the second inclination angle θ2 to the first inclination angle θ1 is 1.2.

As shown in FIGS. 7 and 8, the ratio of 1.1 has a critical feature, and a desired light distribution pattern may not be formed at a ratio of 1.1 or less.

Further, at a ratio of 1.8 or more, since an optical path difference of the light emitted through the side surfaces becomes severe, image quality degradation occurs.

Accordingly, in the present disclosure, the ratio of the first inclination angle θ1 and the second inclination angle θ2 may be limited to a range determined by Equation 1.

As described above, a concave groove at which a center is located at the lowest position may be formed in the upper surface of the diffusion part 11, and in this case, the diffusion part 11 may have a structure in which the upper surface has an elliptical shape and the concave groove of the upper surface may have a circular shape.

The above-described structure may be determined through comparison between FIGS. 2 and 3.

A flat surface is present in an edge of the upper surface in FIG. 2 illustrating a cross-section in a direction of the major axis A, and the concave groove is formed toward an edge of the upper surface in FIG. 3 illustrating a cross-section in a direction of the minor axis B.

Thus, light may be diffused regardless of the upper surface having the elliptical shape as a whole by configuring the concave groove in the upper surface of the diffusion part which reflects and refracts light in the circular shape.

In the present disclosure, since asymmetric light distribution can be provided by adjusting an inclination degree of a side surface without changing an overall lens size, there is an effect of easy design and an advantage for miniaturization. Further, there is an effect in that manufacturing costs of an asymmetric diffusion lens can be reduced.

As described above, the embodiments according to the present disclosure have been described but these are only exemplary, and it may be understood by those skilled in the art that various modifications and other equivalents are possible therefrom. Accordingly, the true technical scope of the present disclosure should be determined by the appended claims.

What is claimed is:

1. An asymmetric diffusion lens for a light emitting diode (LED) backlight unit, comprising:
   a diffusion part of which an upper surface has an elliptical shape having a major axis and a minor axis, and a lower surface has a circular shape;
   a concave accommodation part provided at a center of the lower surface of the diffusion part to provide a space in which an LED package is accommodated;
   an incidence surface which is a boundary surface between the concave accommodation part and the diffusion part; and
   an exit surface as side surfaces and the upper surface of the diffusion part,
   wherein, when an inclination angle (referred to as an angle formed by a virtual vertical line in an upward direction from an edge of the lower surface of the diffusion part and a side surface) of the side surface extending to the major axis of the diffusion part is referred to as a first inclination angle, and an inclination angle of the side surface extending to the minor axis is referred to as a second inclination angle, the first inclination angle is smaller than the second inclination angle, and
   an inclination angle at the other side surface is inclined at an angle between the first inclination angle and the second inclination angle.

2. The asymmetric diffusion lens of claim 1, wherein a ratio of the second inclination angle to the first inclination angle is greater than 1.1 and smaller than 1.8.

3. The asymmetric diffusion lens of claim 2, wherein a concave groove is formed in the upper surface of the diffusion part so that a center of the upper surface of the diffusion part is deepest.

4. The asymmetric diffusion lens of claim 3, wherein an edge circumference of the concave groove has a circular shape.

5. The asymmetric diffusion lens of claim 1, wherein a concave groove is formed in the upper surface of the diffusion part so that a center of the upper surface of the diffusion part is deepest.

6. The asymmetric diffusion lens of claim 5, wherein an edge circumference of the concave groove has a circular shape.

* * * * *